(12) United States Patent
Kuramoto

(10) Patent No.: US 7,643,527 B2
(45) Date of Patent: Jan. 5, 2010

(54) SEMICONDUCTOR LASER

(75) Inventor: Kyosuke Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 143 days.

(21) Appl. No.: 11/910,930

(22) PCT Filed: Mar. 15, 2006

(86) PCT No.: PCT/JP2006/305097

§ 371 (c)(1),
(2), (4) Date: Oct. 8, 2007

(87) PCT Pub. No.: WO2006/112228

PCT Pub. Date: Oct. 26, 2006

(65) Prior Publication Data

US 2009/0022195 A1    Jan. 22, 2009

(30) Foreign Application Priority Data

Apr. 13, 2005   (JP) .............................. 2005-115632

(51) Int. Cl.
*H01S 5/00* (2006.01)
(52) U.S. Cl. .................... 372/45.01; 372/43.01; 372/87
(58) Field of Classification Search .............. 372/45.01, 372/43.01
See application file for complete search history.

(56) References Cited

U.S. PATENT DOCUMENTS

| | | | |
|---|---|---|---|
| 6,746,948 B2 | 6/2004 | Ueda et al. | |
| 6,944,371 B2 | 9/2005 | Kaneko | |
| 7,012,283 B2 | 3/2006 | Tsuda et al. | |
| 7,091,056 B2 | 8/2006 | Asatsuma et al. | |
| 7,372,077 B2 | 5/2008 | Hata et al. | |
| 2004/0245540 A1 | 12/2004 | Hata et al. | |
| 2005/0030999 A1* | 2/2005 | Yoneda | 372/46 |

FOREIGN PATENT DOCUMENTS

| | | |
|---|---|---|
| CN | 1519998 A | 8/2004 |
| CN | 1582520 A | 2/2005 |
| JP | 6-37386 A | 2/1994 |
| JP | 10-93186 A | 4/1998 |
| JP | 2002-33512 A | 1/2002 |
| JP | 2002-100837 A | 4/2002 |
| JP | 2002-158405 A | 5/2002 |
| JP | 2003-115632 A | 4/2003 |

(Continued)

*Primary Examiner*—Dung T Nguyen
(74) *Attorney, Agent, or Firm*—Leydig, Voit & Mayer, Ltd.

(57) ABSTRACT

A semiconductor laser having a high electrostatic withstand voltage, resistant to a power supply surge, and having improved long-term reliability is obtained by reducing current leakage through a threading dislocation portion. The semiconductor laser includes a substrate having a high dislocation region having a dislocation density of $1 \times 10^5$ cm$^{-2}$ or more, a crystalline semiconductor structure located on the substrate and having an active layer, an insulating film located on the semiconductor structure, a surface electrode located on the insulating film and electrically continuous with the semiconductor structure for injection of a current into the active layer, and a back electrode located on a rear surface of the substrate. The semiconductor laser has a laser resonator with a length L, and the area of the surface electrode is $120 \times L$ µm$^2$ or less.

7 Claims, 12 Drawing Sheets

FOREIGN PATENT DOCUMENTS

| | | |
|---|---|---|
| JP | 2003-163417 A | 6/2003 |
| JP | 2003-188463 A | 7/2003 |
| JP | 2003-229637 A | 8/2003 |
| JP | 2003-229638 A | 8/2003 |
| JP | 2003-229639 A | 8/2003 |
| JP | 2004-240361 A | 8/2004 |
| JP | 2004-260152 A | 9/2004 |

* cited by examiner

80 μm

50 μm  80 μm

80 μm

80 μm

80 μm

50 μm  80 μm

80μm

80μm

SEMICONDUCTOR LASER

TECHNICAL FIELD

The present invention relates to a semiconductor laser made on a substrate of a high threading dislocation density, e.g., a GaN substrate.

BACKGROUND ART

GaAs substrates and InP substrates have been used as substrates used for semiconductor light emitting elements and semiconductor electronic devices (see, for example, patent document 1). On the other hand, in recent years, semiconductor light emitting elements and semiconductor electronic devices using substrates such as GaN substrates having a threading dislocation density much higher than those of GaAs and InP substrates have been made and put to practical use. For example, as such devices, semiconductor lasers and light emitting diodes using III-V group nitride compound semiconductors and capable of light emission from a blue region to an ultraviolet region are known.

Patent Document 1: Japanese Patent Laid-Open No. 6-37386

DISCLOSURE OF THE INVENTION

Problems to be Solved by the Invention

However, it is known that the possibility of malfunction due to a power supply surge or static electricity in such devices is much stronger than that in semiconductor light emitting devices using a GaAs substrate or an InP substrate. The reason for this has not been made clear but a threading dislocation existing in the substrate has been found to be a major factor. It has also been found that not only a threading dislocation in a light emitting portion, i.e., a current injection portion, in a semiconductor laser or a light emitting diode but also a threading dislocation in a portion other than the current injection portion, i.e., a current non-injection portion, is a major factor in degradation or malfunction. In semiconductor lasers in general, this phenomenon is noticeable because the current injection portion is much smaller than the current non-injection portion.

FIG. 19 is a sectional view of a conventional semiconductor laser having a ridge waveguide. As shown in the figure, a semiconductor layer 102 of a III-V group nitride compound is formed on a GaN substrate 101. Also, a capacitor is formed by an insulating film 103 for blocking a current and a semiconductor layer 102 and an electrode 104 between which the insulating film 103 is sandwiched. As a result, the semiconductor laser has an extremely low impedance with respect to an instantaneous change in voltage due to a power supply surge or static electricity, i.e., an extremely high frequency component. Also, pin holes and a locally thin portion exist in the insulating film 103 and the impedance is further reduced at such portions. Further, a threading dislocation 105 has a substantially low resistance in comparison with other portions due to its structural defect.

Therefore, if a low-impedance portion of the insulating film 101 is adjacent or close to the threading dislocation 105, a current flows through a path: surface electrode 104, insulating film 103, threading dislocation 105 and back electrode 106. Since the threading dislocation 105 is extremely narrow, the current density thereof becomes extremely high if current are concentrated thereon. Destruction of the semiconductor layer 102 or breakdown of the insulating film 103 on the semiconductor layer 102 results. A steady current leak path is thereby formed in this portion, which makes it difficult to cause a current to flow to the light emitting layer through the current injection portion 107. A problem arises that a degradation in performance or malfunction of the device occurs.

In GaN substrates presently put to practical use and sold on the market, a low dislocation region in which the threading dislocation density is comparatively low and a high dislocation region which is formed in stripe form in the low dislocation region and in which the threading dislocation density is high exist. This high dislocation region is observed as a region in stripe form apparently different in contrast from other regions and having a width of several microns to several ten microns, when seen from the substrate upper surface or the substrate lower surface. The above-described problem occurs easily with the high dislocation region or in a region in the vicinity of the high dislocation region because threading dislocations exist densely therein. In semiconductor lasers using a GaN material in particular, the occurrence of the above-described problem is increased since the resistance of the p-type layer is high, and since the series resistance of the current injection portion is high.

The present invention has been achieved to solve the above-described problem, and an object of the present invention is to obtain a semiconductor laser in which a current leak through a threading dislocation portion is reduced to improve the long-term reliability, surge resistance and static electricity resistance.

ADVANTAGES OF THE INVENTION

According to the present invention, a semiconductor laser can be obtained in which a current leak through a threading dislocation portion is reduced to improve the long-term reliability, surge resistance and static electricity resistance.

BRIEF DESCRIPTION OF DRAWING FIGURES

BEST MODE FOR CARRYING OUT THE INVENTION

First Embodiment

A current leak through a threading dislocation portion occurs only at a portion at which a surface electrode and a back electrode are formed. Therefore, the current leak through the threading dislocation portion can be reduced if the area of the surface electrode or the back electrode is reduced. An experiment on the relationship between the area of the surface electrode or the back electrode and the electrostatic withstand voltage was made as described below. The electrostatic withstand voltage is the average of breakdown voltages when a current is caused to flow in the forward direction in a machine model.

Figure 1:
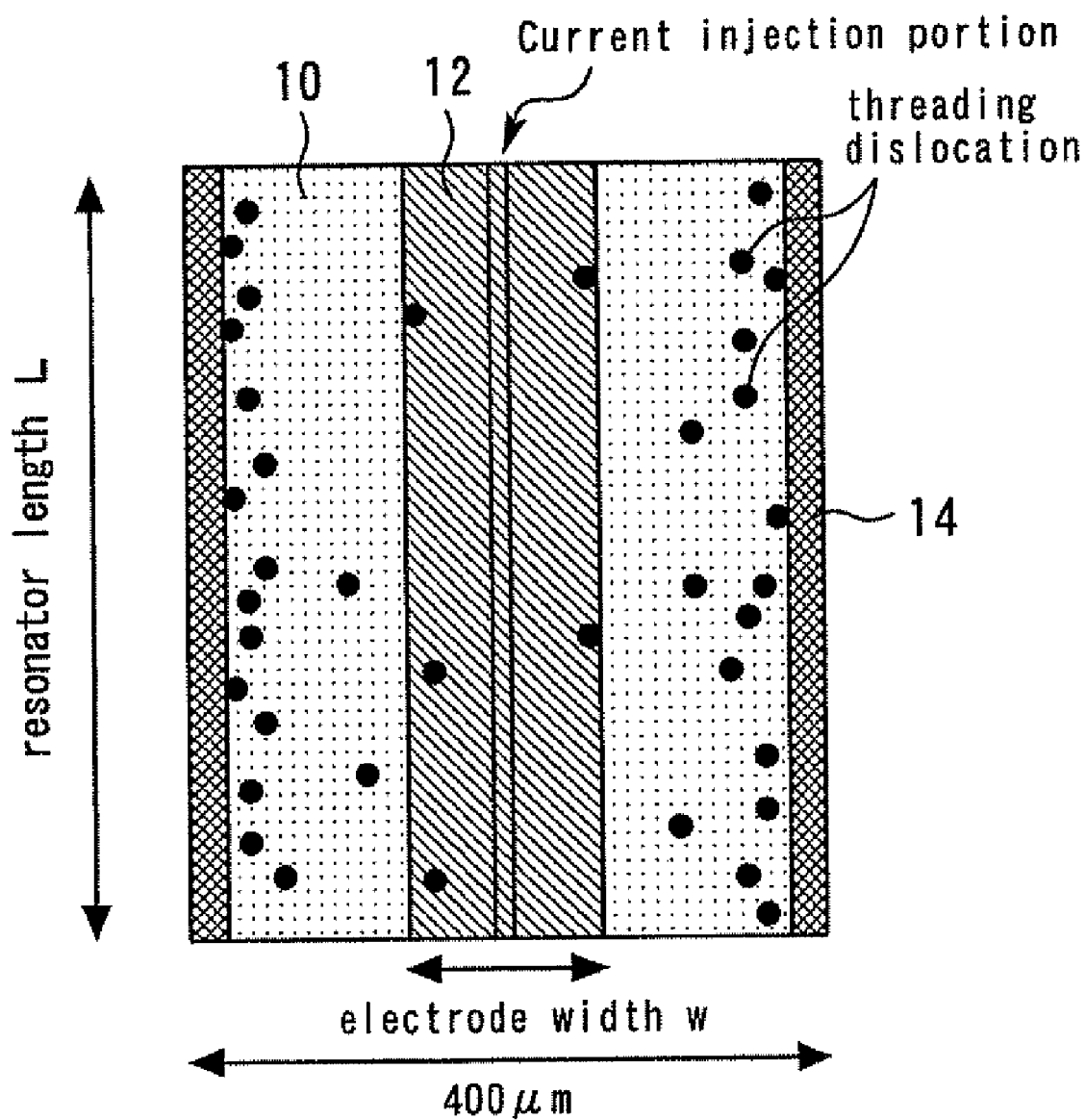
FIG. 1 is a plan view of a semiconductor laser used in experimentation.

FIG. 1 is a top view of a semiconductor laser used in the experiment. As this semiconductor laser, three types of lasers respectively having resonator lengths L of 400, 600 and 800 µm by cleavage were formed. High dislocation regions 14 exist in the GaN substrate 1 at intervals of 400 µm. The chips were separated so as to have a width of 400 µm along the high dislocation regions 14. Black round marks in the figure schematically indicate positions at which threading dislocations exist in the GaN substrate and the semiconductor layer.

Figure 2:
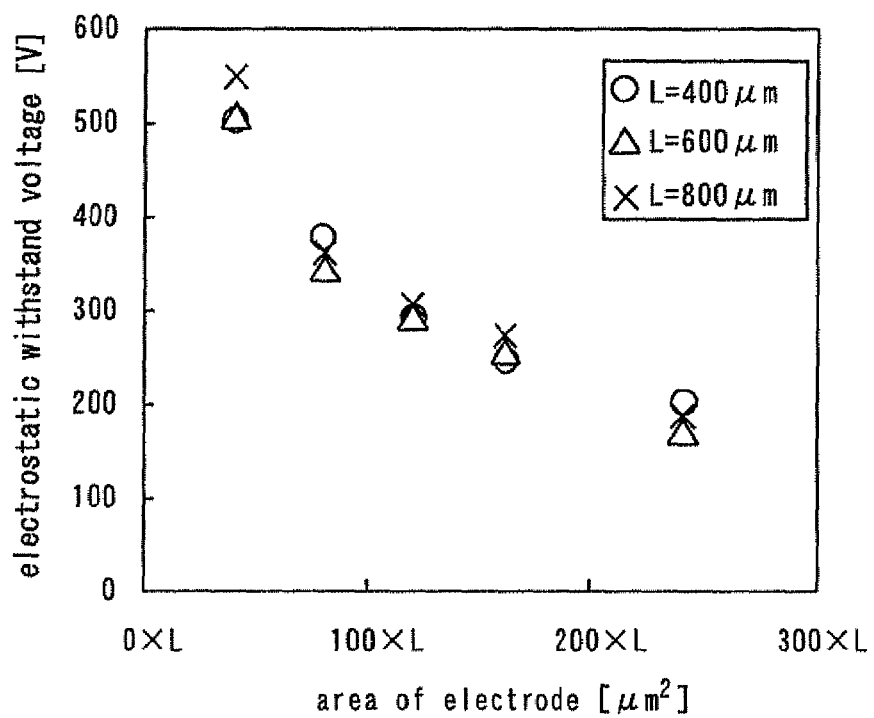
FIG. 2 is a graph relating surface electrode area to withstand voltage of a semiconductor laser.

FIG. 2 shows the relationship between the area of the surface electrode and the electrostatic withstand voltage when the surface electrode width w (µm) was changed in the semiconductor laser. From the results shown in FIG. 2, it was found that the electrostatic withstand voltage was increased with the reduction in the area of the surface electrode. The reason for this is thought to be that the probability of generation of a leak current from a pin hole in the insulating film or a portion of a small film thickness or low film quality through a threading dislocation is reduced with the reduction in the electrode area. It was also found that the electrostatic withstand voltage was reduced with the reduction in resonator length L. The reason for this is thought to be that the resistance value of the essential current injection portion is increased with the reduction in resonator length L, and that the occurrence of a current leak is increased thereby. It was also found from a long-term life test that the life was increased with the reduction in the area of the surface electrode.

Therefore, a semiconductor laser having a high electrostatic withstand voltage, resistant to a power supply surge and having improved long-term reliability can be obtained by reducing the area of the surface electrode. More specifically, the area of the surface electrode is set to $120 \times L$ µm$^2$ or less, more preferably $80 \times L$ µm$^2$ or less, and further preferably $60 \times L$ µm$^2$ or less.

Figure 3:
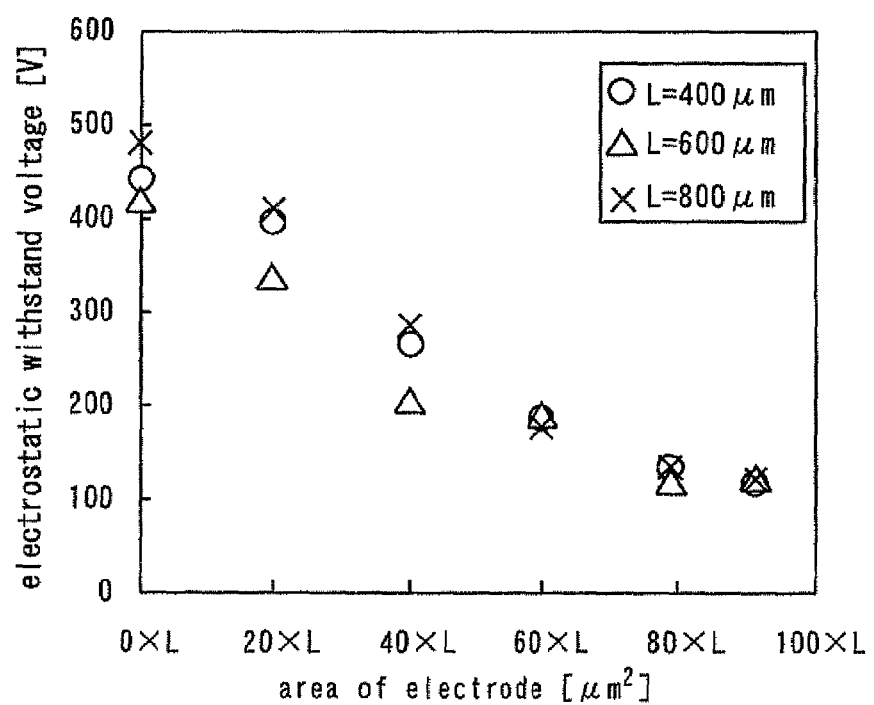
FIG. 3 is a graph relating area near a center of a high dislocation region and withstand voltage of a semiconductor laser.
Figure 4:
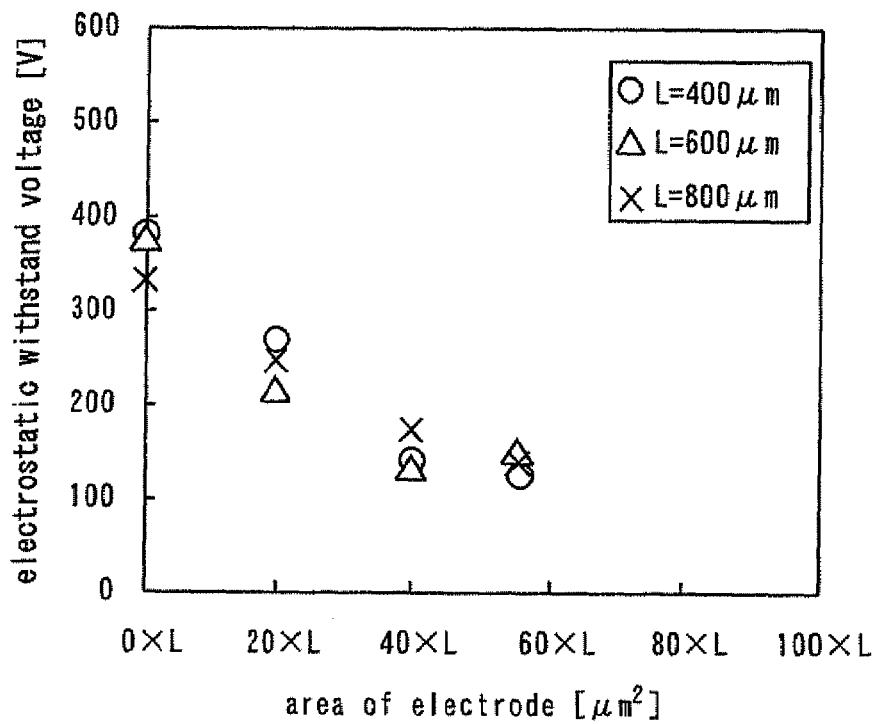
FIG. 4 is a graph relating area near a center of a high dislocation region and withstand voltage of a semiconductor laser.

FIG. 3 shows the relationship between the area of a portion within a range of 100 µm from a center of the high dislocation region on opposite sides of the same in the surface electrode and the electrostatic withstand voltage, and FIG. 4 shows the relationship between the area of a portion within a range of 60 µm and the electrostatic withstand voltage. From these results, it was found that the electrostatic withstand voltage of the portion within the 100 µm range from the center of the high dislocation region was reduced relative to that of other portions, and that the electrostatic withstand voltage of the portion within the 60 µm range was further reduced. The reason for this is thought to be that the threading dislocation density is originally high in the vicinity of the high dislocation region and, in addition, threading dislocations increased from the high dislocation region to a portion in the low dislocation region with the progress in crystal growth of the semiconductor layer on the GaN substrate.

Therefore, a semiconductor laser having a high electrostatic withstand voltage, resistant to a power supply surge and having improved long-term reliability can be obtained by placing the surface electrode as remotely as possible from the vicinity of the high dislocation region or by minimizing the area of the surface electrode in the vicinity of the high dislocation region. More specifically, the area of the portion within the 100 µm range from the center of the high dislocation region on the opposite sides of the same in the surface electrode is set to $60 \times L$ µm$^2$ or less, preferably $45 \times L$ µm$^2$ or less. Also, the area of the portion within the 60 µm range is set to $20 \times L$ µm$^2$ or less, preferably $15 \times L$ µm$^2$ or less, and further preferably $10 \times L$ µm$^2$ or less.

Figure 5:
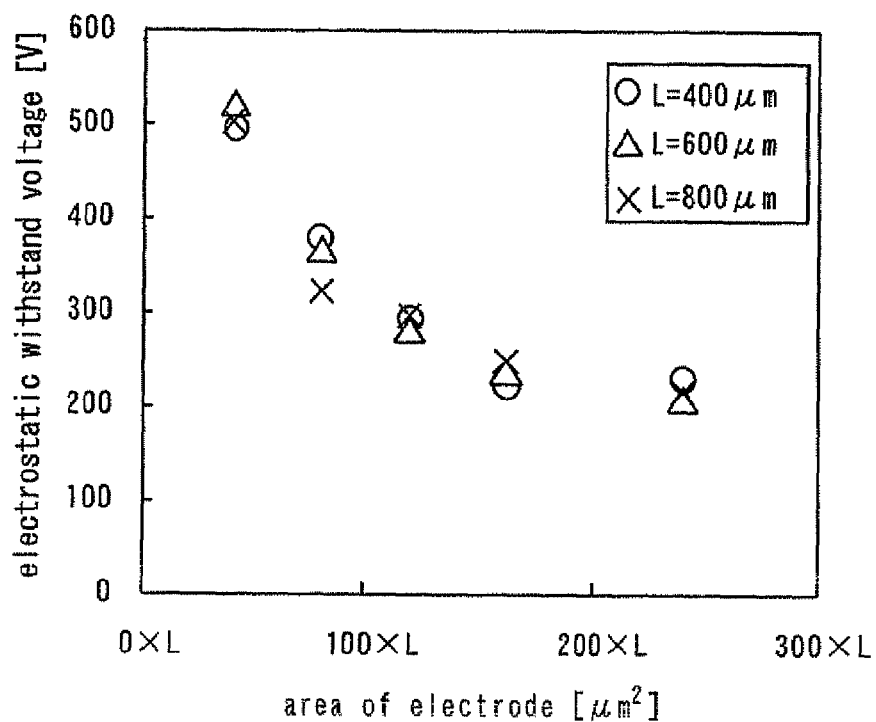
FIG. 5 is a graph relating back surface electrode area to withstand voltage of a semiconductor laser.

FIG. 5 shows the relationship between the area of the back electrode and the electrostatic withstand voltage. From the results shown in FIG. 5, it was found that the electrostatic withstand voltage was increased with the reduction in the area of the back electrode as in the case of surface electrode.

Therefore, a semiconductor laser having a high electrostatic withstand voltage, resistant to a power supply surge and having improved long-term reliability can be obtained by reducing the area of the back electrode. More specifically, the area of the back electrode is set to $140 \times L$ µm$^2$ or less, more preferably $100 \times L$ µm$^2$ or less, and further preferably $60 \times L$ µm$^2$ or less.

Figure 6:
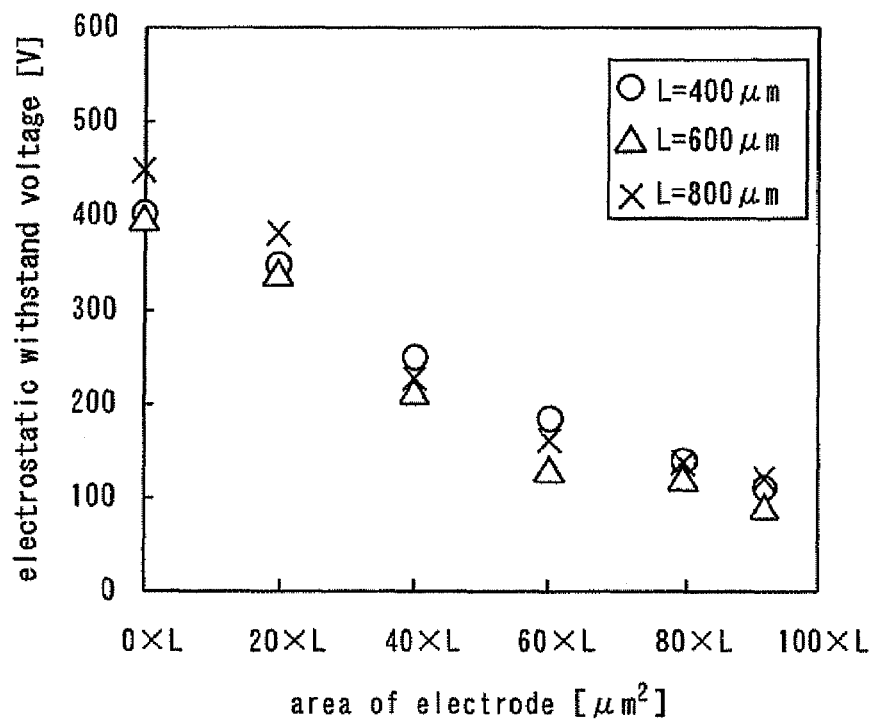
FIG. 6 is a graph relating area near a center of a high dislocation region and withstand voltage of a semiconductor laser.
Figure 7:
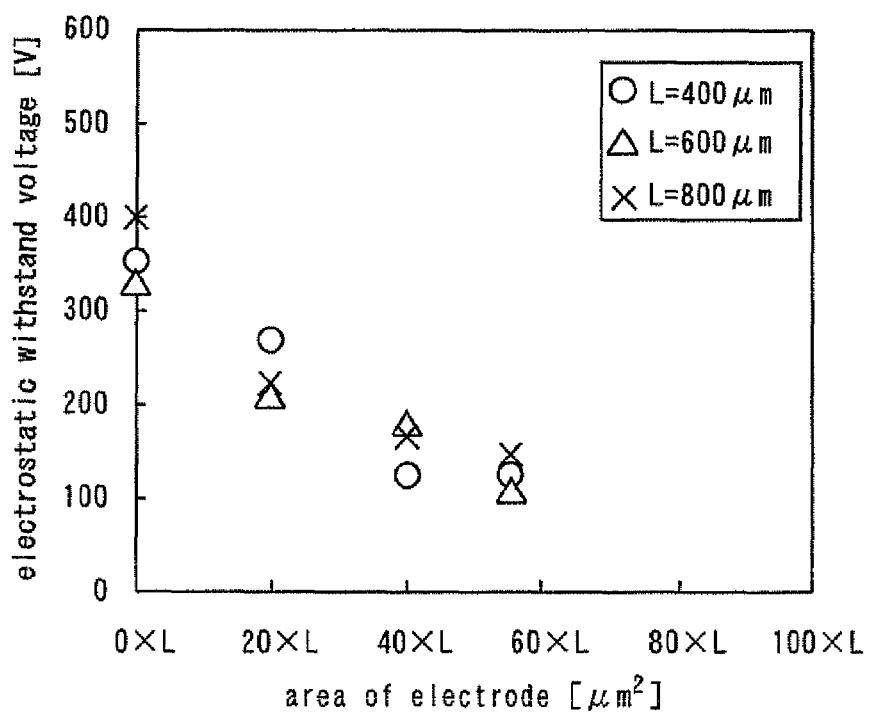
FIG. 7 is a graph relating area near a center of a high dislocation region and withstand voltage of a semiconductor laser.

FIG. 6 shows the relationship between the area of a portion within a range of 100 µm from a center of the high dislocation region on opposite sides of the same in the back electrode and the electrostatic withstand voltage, and FIG. 7 shows the relationship between the area of a portion within a range of 60 µm and the electrostatic withstand voltage. From these results, it was found that the electrostatic withstand voltage of the portion within the 100 µm range from the center of the high dislocation region was reduced relative to that of other portions, and that the electrostatic withstand voltage of the portion within the 60 µm range was further reduced.

Therefore, a semiconductor laser having a high electrostatic withstand voltage, resistant to a power supply surge and having improved long-term reliability can be obtained by placing the back electrode as remotely as possible from the vicinity of the high dislocation region or by minimizing the area of the back electrode in the vicinity of the high dislocation region. More specifically, the area of the portion within the 100 µm range from the center of the high dislocation region on the opposite sides of the same is set to $80 \times L$ µm$^2$ or less, preferably $65 \times L$ µm$^2$ or less. Also, the area of the portion within the 60 µm range is set to $20 \times L$ µm$^2$ or less, preferably $45 \times L$ µm$^2$ or less, and further preferably $25 \times L$ µm$^2$ or less.

The present invention can be applied to semiconductor lasers using other substrates in which a high dislocation region having a threading dislocation density of $1 \times 10^5$ cm$^{-2}$ or higher as well as to semiconductor lasers using the GaN substrate exists, and the same effects can be achieved in application to such semiconductor lasers.

Figure 8:
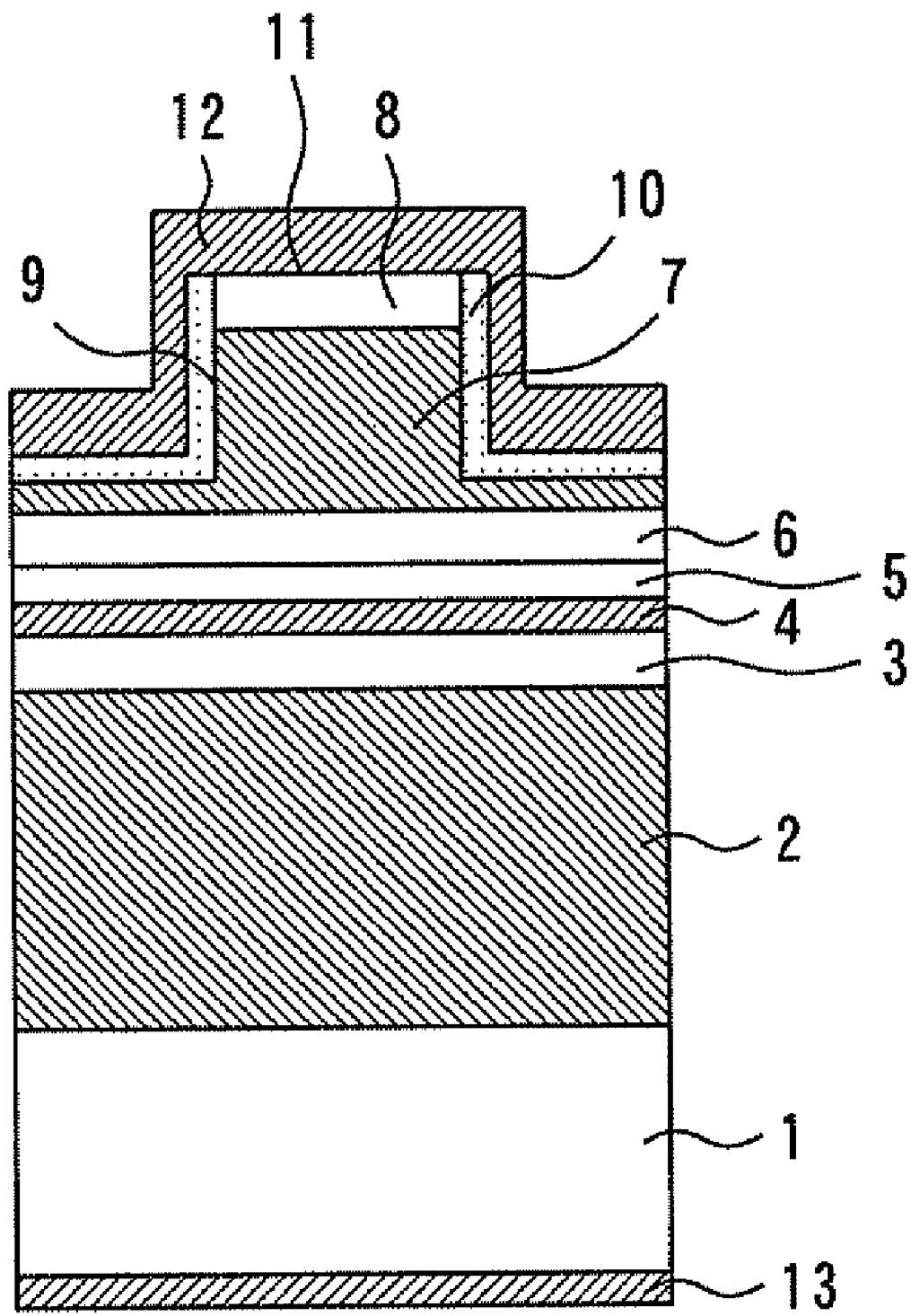
FIG. 8 is a cross-sectional view of a semiconductor laser according to an embodiment of the invention.

A semiconductor laser according to First Embodiment of the present invention will be described with reference to the drawings. FIG. 8 is a sectional view of a nitride semiconductor laser according to First Embodiment of the present invention seen from a laser emission surface. However, only a light emitting portion in the vicinity of a ridge is shown. In this semiconductor laser, an n-type AlGaN clad layer 2, an n-type GaN light guide layer 3, an active layer 4, which is a light emitting layer, a p-type AlGaN electron barrier layer 5, a p-type GaN light guide layer 6, a p-type AlGaN clad layer 7 and a p-type GaN contact layer 8 are successively formed as a semiconductor crystal on a Ga surface which is a major surface of a GaN substrate 1.

The GaN substrate 1 has a thickness of 100 μm. A high dislocation region having a dislocation density of $1 \times 10^5$ cm$^{-2}$ or higher is formed in stripe form in the GaN substrate 1. The n-type AlGaN clad layer 2 is formed of an AlGaN material having an Al composition ratio of 0.07, has a thickness of 1 μm, and is doped with, for example, Si provided as an n-type impurity. The n-type GaN light guide layer 3 is formed of an AlGaN material and as a thickness of 100 nm.

The active layer 4 has a double quantum well structure in which an undoped n-side InGaN-SCH layer having an In composition ratio of 0.02, an undoped InGaN well having an In composition ratio of 0.12, an undoped InGaN barrier layer having an In composition ratio of 0.02, an undoped InGaN well layer having an In composition ratio of 0.12 and an undoped p-side InGaN-SCH layer having an In composition ratio of 0.02 are stacked in order. The thickness of the n-side InGaN-SCH layer is 30 nm, the thickness of the InGaN well is 50 nm, and the thickness of the InGaN barrier layer is 8.0 nm.

The p-type AlGaN electron barrier layer 5 is formed of an AlGaN material having an Al composition ratio of 0.2, has a thickness of 20 nm, and is doped with Mg provided as a p-type impurity. The p-type GaN light guide layer 6 is formed of an AlGaN material and has a thickness of 100 nm. The p-type AlGaN clad layer 7 is formed of an AlGaN material having an Al composition ratio of 0.07 and has a thickness of 400 nm. The p-type GaN contact layer 8 is formed of a GaN material and has a thickness of 100 nm.

A ridge 9 for guiding a light wave is formed in the <1-100> orientation as a portion in the p-type AlGaN clad layer 7 and the p-type GaN contact layer 8 by etching. The width of the ridge 9 is 1.5 μm. The ridge 9 is formed in a low dislocation region between high dislocation regions formed in stripe form in The GaN substrate and having a width of several microns to several ten microns.

An insulating film 10 formed of SiO$_2$ and having a thickness of 200 nm is formed for surface protection and electrical insulation on side surfaces of the ridge 9 and on the p-type AlGaN clad layer 7 at the side of the ridge 9. An opening 11 is formed in the insulating film 10 on an upper surface portion of the ridge 9. A p-type surface electrode 12 and the p-type GaN contact layer 8 have electrical conduction therebetween through the opening 11. The surface electrode 12 is an electrode for injecting a current only into a partial region in the active layer 4 by current blocking with the insulating film 10, and has a structure in which Pd film and Au film is laid one on another.

An n-type back electrode 13 is formed on an N surface opposite from the one major Ga surface of the GaN substrate 1. The back electrode 13 has a structure in which Ti film and Au film are laid one on another.

Figure 9:
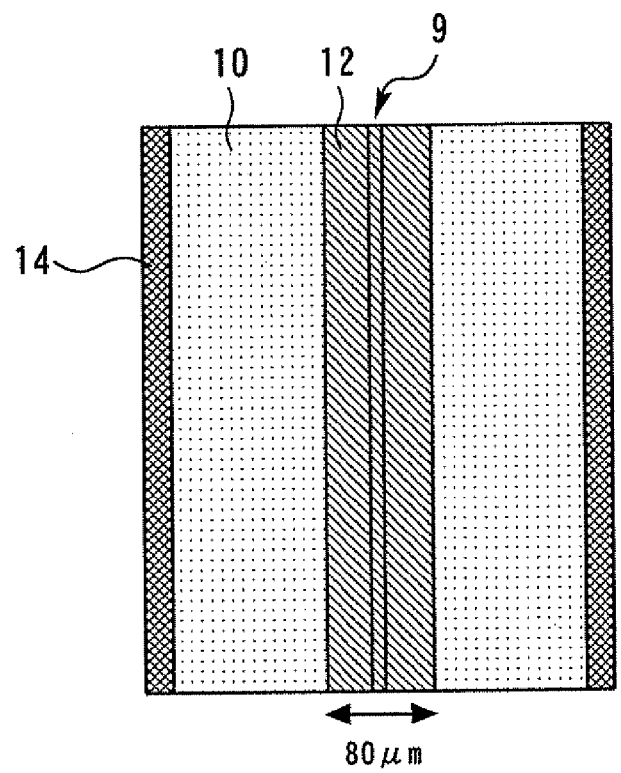
FIG. 9 is a top view of the semiconductor laser of FIG. 8.

FIG. 9 is a top view of the semiconductor laser according to First Embodiment of the present invention. Laser element are formed by cleavage to have a resonator length of 600 μm and separated to have a width of 400 μm. High dislocation regions 14 exist in the GaN substrate at intervals of 400 μm. The elements are separated along the high dislocation regions 14. High dislocation regions 14 therefore exist on opposite sides of each element.

The surface electrode 12 has a length of 600 μm in the resonator direction but has an extremely small width of 80 μm. If the resonator length is L (μm), the area of the electrode is 80×L μm$^2$. On the other hand, the back electrode 13 is formed substantially through the entire area of the lower surface of the semiconductor laser.

A method of manufacturing the semiconductor laser according to this embodiment will now be described. N-type AlGaN clad layer 2, n-type GaN light guide layer 3, active layer 4 including an undoped n-side InGaN-SCH layer, an undoped InGaN/InGaN double quantum well active layer and an undoped p-side InGaN-SCH layer, p-type AlGaN electron barrier layer 5, p-type GaN light guide layer 6, p-type AlGaN clad layer 7 and p-type GaN contact layer 8 are successively formed on GaN substrate 1 having its surface cleaned in advance by thermal cleaning or the like using a metal organic chemical vapor deposition (MOCVD).

The temperatures at which these layers are grown are, for example, a temperature of 1000° C. at which n-type AlGaN clad layer 2 and n-type GaN light guide layer 3 are grown, a temperature of 780° C. at which the layers from the undoped n-side InGaN-SCH layer to the undoped p-side InGaN-SCH layer are grown, and a temperature of 1000° C. at which the layers from p-type AlGaN electron barrier layer 5 to p-type GaN contact layer 8 are grown.

A resist is applied to the entire substrate surface after the completion of the above-described crystal growth, and a resist pattern corresponding to the shape of ridge 9 is formed by lithography. Etching to an internal portion of p-type AlGaN clad layer 7 is performed, for example, by a RIE method, with this resist pattern used as a mask. Ridge 9 is formed as an optical waveguide structure by this etching. In this etching, chlorine based gas for example is used as etching gas.

An insulating film 10 formed of SiO$_2$ and having a thickness of 0.2 μm is formed on the entire substrate surface by, for example, a CVD method, a vacuum deposition method or a sputtering method without removing the resist pattern used as a mask. Thereafter, a lift-off step in which the SiO$_2$ film on ridge 9 is removed simultaneously removal of the resist is performed. Opening 11 is thereby on ridge 9.

Pt film and Au film are successively formed on the entire substrate surface, for example, by a vacuum deposition method. Thereafter, surface electrode 12 is formed by resist application, lithography and wet etching or dry etching.

Thereafter, Ti film and Al film are successively formed on the entire back surface of the substrate by a vacuum deposition method, thereby forming back electrode 13. Back electrode 13 is formed into a desired pattern by resist application, lithography and wet etching or dry etching. Alloying for making an ohmic contact is thereafter performed.

Thereafter, the substrate is worked into a bar form by cleavage or the like to form two resonator end surfaces. Further, an end surface coating is formed on the resonator end surfaces, and the bar is formed into a chip by cleavage or the like. The semiconductor laser according to this embodiment is thus manufactured.

The electrostatic withstand voltages of the semiconductor laser according to this embodiment and a conventional semiconductor laser having a surface electrode area of 380×L μm$^2$ were measured. The average electrostatic withstand voltage of the semiconductor laser according to this embodiment was 350 V, while that of the conventional semiconductor laser was 174 V. Thus, an improvement in electrostatic withstand voltage in the semiconductor laser according to this embodiment was observed. The reason for this is thought to be that if the electrode area is reduced, the probability of generation of a leak current from a pin hole in the insulating film or a portion of a small film thickness or low film quality through a threading dislocation and the back electrode is reduced.

While the description has been made of the case of using a GaN substrate, the semiconductor laser according to this embodiment also has the same advantage in a case where a substrate having a high dislocation region of a dislocation density higher than $1 \times 10^5$ cm$^{-2}$, and it is particularly advantageous if the dislocation density in the substrate is increased.

While in this embodiment the surface electrode 12 is a p-type electrode, it is an n-type electrode in a case where an insulating film and a surface electrode are formed on an n-type semiconductor by using a p-type substrate.

Second Embodiment

Figure 10:
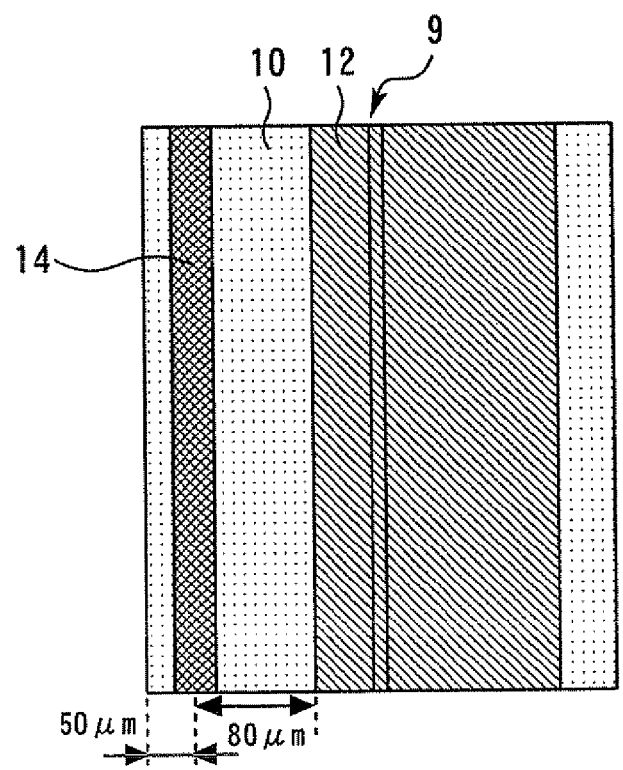
FIG. 10 is a top view of a semiconductor laser according to an embodiment of the invention.

FIG. 10 is a top view of a semiconductor laser according to Second Embodiment of the present invention. This semiconductor laser is formed by cleavage to have a resonator length of 600 μm and separated to have a width of 400 μm. Separation is performed at a position shifted by 50 μm from a center of a high dislocation region 14. Therefore, only one high dislocation region 14 exists in the semiconductor laser. A surface electrode 12 is formed at a position distanced by 80 μm from the center of the high dislocation region 14. In other respects, the structure of this semiconductor laser is the same as that in First Embodiment. Therefore no further description of the structure will be made. As a result, a semiconductor laser having a high electrostatic withstand voltage, resistant to a power supply surge and having improved long-term reliability can be obtained.

Third Embodiment

Figure 11:
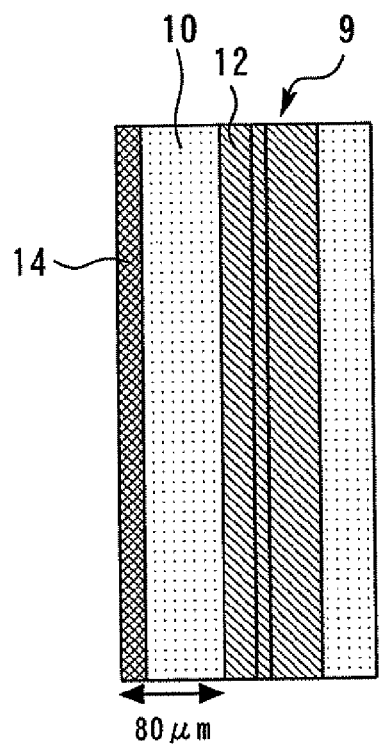
FIG. 11 is a top view of a semiconductor laser according to an embodiment of the invention.

FIG. 11 is a top view of a semiconductor laser according to Third Embodiment of the present invention. This semiconductor laser is formed by cleavage to have a resonator length of 600 μm and separated to have a width of 200 μm. The element is separated at a center of a high dislocation region 14 and at a center between high dislocation regions 14. Therefore, the high dislocation region 14 exists only at one side of the element. A surface electrode 12 is formed at a position distanced by 80 μm from the center of the high dislocation region 14. In other respects, the structure of this semiconductor laser is the same as that in First Embodiment. Therefore no further description of the structure will be made. As a result, a semiconductor laser having a high electrostatic withstand voltage, resistant to a power supply surge and having improved long-term reliability can be obtained.

Fourth Embodiment

Figure 12:
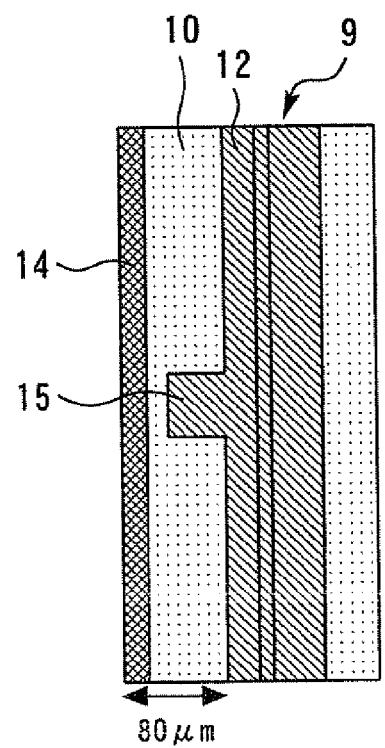
FIG. 12 is a top view of a semiconductor laser according to an embodiment of the invention.

FIG. 12 is a top view of a semiconductor laser according to Fourth Embodiment of the present invention. This semiconductor laser has, in addition to the construction in Third Embodiment, an electrode pad portion 15 for wiring on the surface electrode 12. The electrode pad portion 15 has a width of 50 μm and length of 50 μm. The area of the surface electrode 12 existing in the portion within a range of 60 μm from the center of the high dislocation region on the opposite sides of the same in the surface electrode is 1500 μm$^2$ (2.5×L μm$^2$ if the resonator length is L (μm)). As a result, a semiconductor laser having a high electrostatic withstand voltage, resistant to a power supply surge and having improved long-term reliability can be obtained.

Fifth Embodiment

Figure 13:
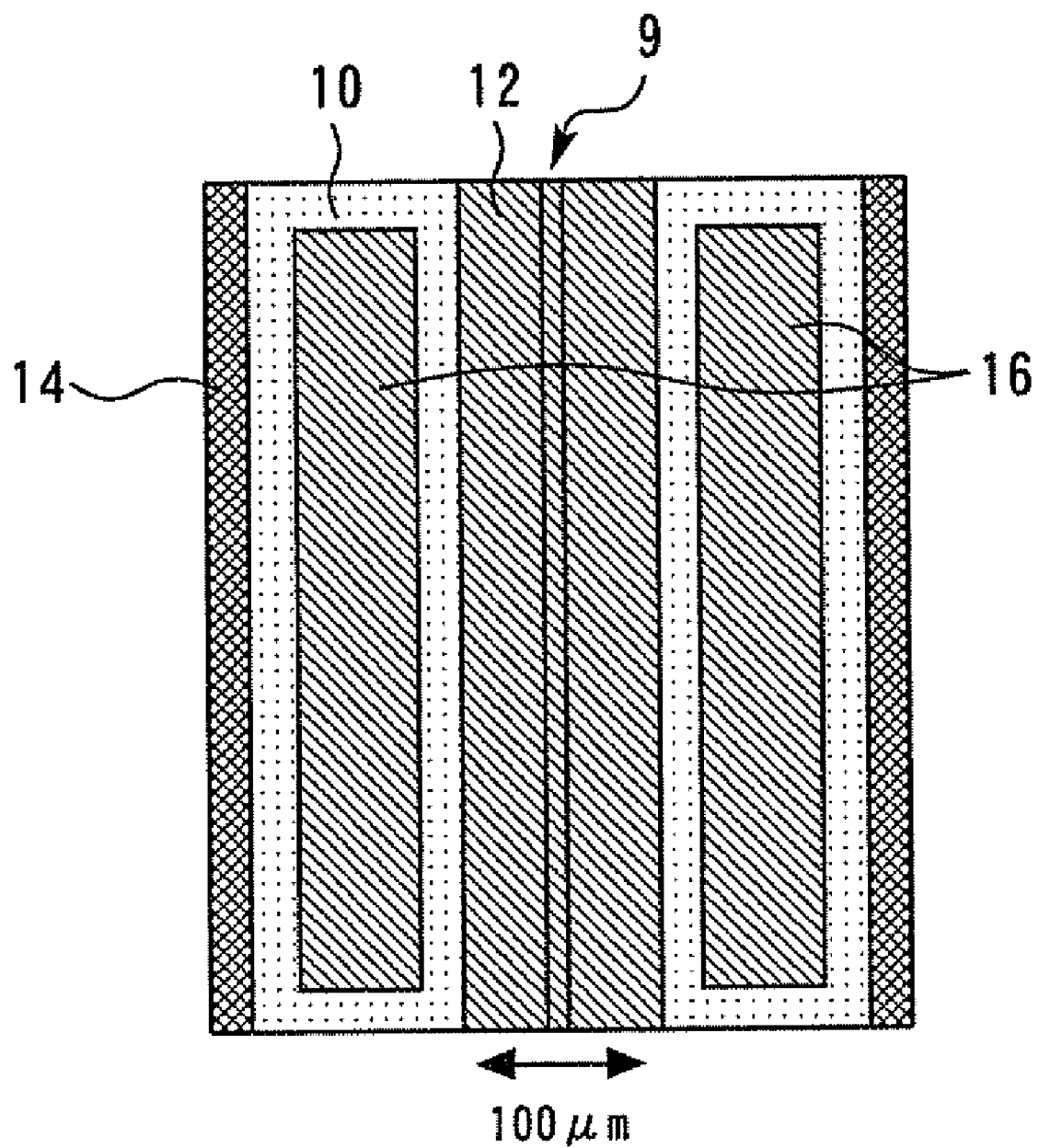
FIG. 13 is a top view of a semiconductor laser according to an embodiment of the invention.

FIG. 13 is a top view of a semiconductor laser according to Fifth Embodiment of the present invention. This semiconductor laser is formed by cleavage to have a resonator length of 600 μm and separated to have a width of 400 μm. The element is separated at positions on high dislocation regions 14. Therefore, high dislocation regions 14 exist at opposite sides of the element.

A surface electrode 12 for supplying a current has a length of 600 μm in the resonator direction but has an extremely small width of 10 μm. The area of the surface electrode 12 is 100×L μm$^2$ if the resonator length is L (μm).

Further, surface dummy electrodes 16 electrically insulated from the surface electrode 12 are formed at certain distances from the surface electrode 12 on the insulating film. No current is caused to flow through the surface dummy electrodes 16. At the time of bonding of the surface electrode 12 side to a sub mount by soldering, not only the surface electrode 12 but also the surface dummy electrodes 16 are bonded to the sub mount. Therefore, the bonding area is increased and the stability with which the element is bonded can be improved.

Sixth Embodiment

Figure 14:
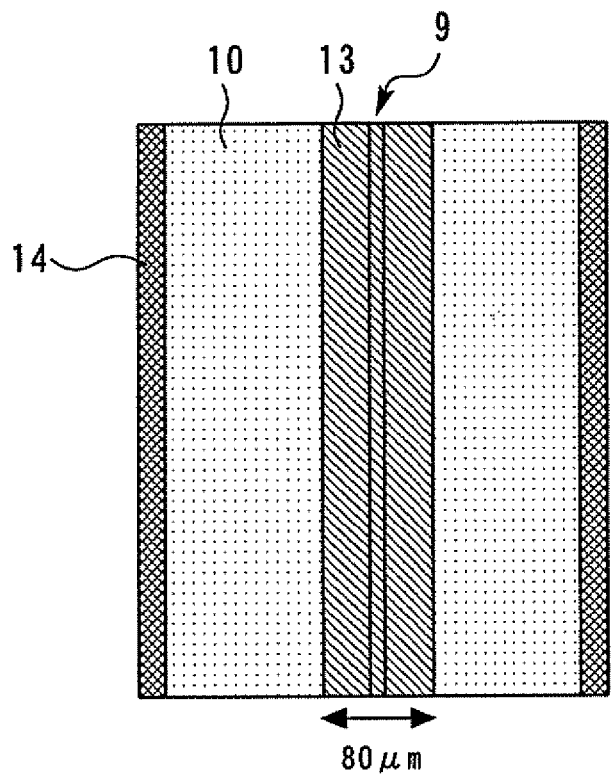
FIG. 14 is a bottom view of a semiconductor laser according to an embodiment of the invention.

FIG. 14 is a bottom view of a semiconductor laser according to Sixth Embodiment of the present invention. This semiconductor laser is formed by cleavage to have a resonator length of 600 μm and separated to have a width of 400 μm. High dislocation regions 14 exist at intervals of 400 μm on a GaN substrate. The element is separated along the high dislocation regions 14. A back electrode 13 has a length of 600 μm in the resonator direction but has an extremely small width of 80 μm. The area of the back electrode 13 is 80×L μm$^2$ if the resonator length is L (μm).

The electrostatic withstand voltages of the semiconductor laser according to this embodiment and a conventional semiconductor laser having a back electrode area of 380×L μm$^2$ were measured. The average electrostatic withstand voltage of the semiconductor laser according to this embodiment was 365 V, while that of the conventional semiconductor laser was 196 V. Thus, an improvement in electrostatic withstand voltage in the semiconductor laser according to this embodiment was observed. The reason for this is thought to be that if the electrode area is reduced, the probability of generation of a leak current from a surface electrode, a pin hole in the insulating film or a portion of a small film thickness or low film quality through a threading dislocation and the back electrode is reduced.

While the description has been made of the case of using a GaN substrate, the semiconductor laser according to this embodiment also has the same advantage in a case where a substrate having a high dislocation region of a dislocation density higher than $1 \times 10^5$ cm$^{-2}$, and it is particularly advantageous if the dislocation density in the substrate is increased.

The back electrode 13 is an n-type electrode in a case where an n-type substrate is used. The back electrode 13 is a p-type electrode in a case where a p-type substrate is used.

Seventh Embodiment

Figure 15:
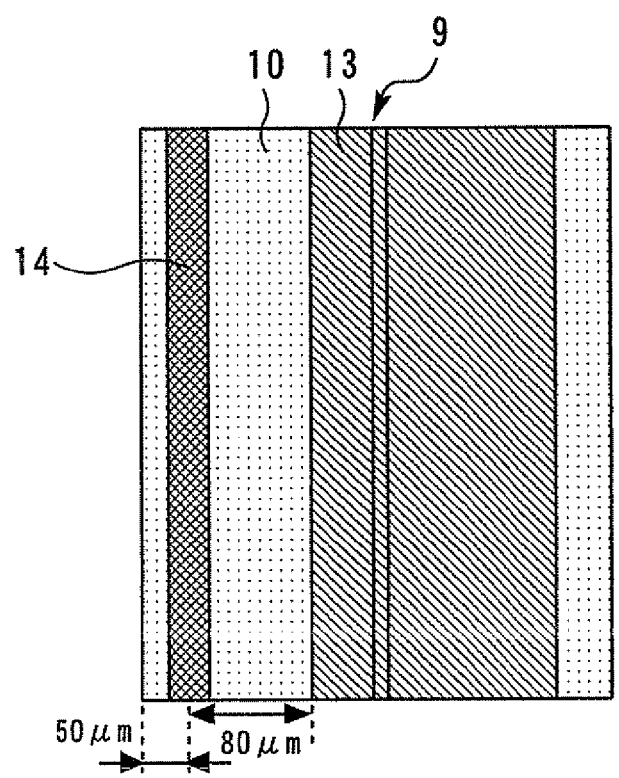
FIG. 15 is a bottom view of a semiconductor laser according to an embodiment of the invention.

FIG. 15 is a bottom view of a semiconductor laser according to Seventh Embodiment of the present invention. This semiconductor laser is formed by cleavage to have a resonator length of 600 μm and separated to have a width of 400 μm. Separation is performed at a position shifted by 50 μm from a center of a high dislocation region 14. Therefore, only one high dislocation region 14 exists in the semiconductor laser. A back electrode 13 is formed at a position distanced by 80 μm from the center of the high dislocation region 14. In other respects, the structure of this semiconductor laser is the same as that in Sixth Embodiment. Therefore no further description of the structure will be made. As a result, a semiconductor laser having a high electrostatic withstand voltage, resistant to a power supply surge and having improved long-term reliability can be obtained.

Eighth Embodiment

Figure 16:
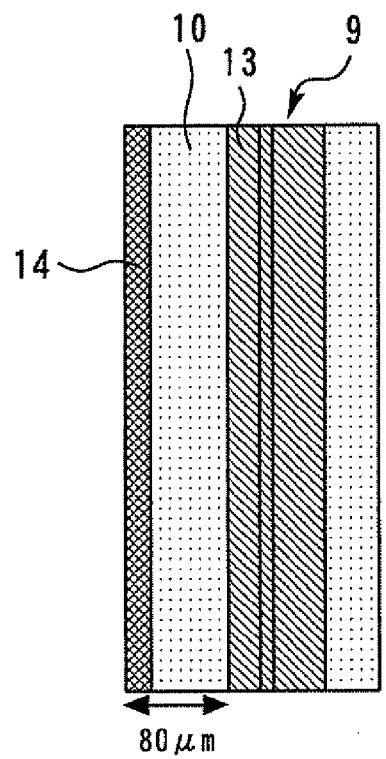
FIG. 16 is a bottom view of a semiconductor laser according to an embodiment of the invention.

FIG. 16 is a bottom view of a semiconductor laser according to Eighth Embodiment of the present invention. This semiconductor laser is formed by cleavage to have a resonator length of 600 μm and separated to have a width of 200 μm. The element is separated at a center of a high dislocation region 14 and at a center between high dislocation regions 14. Therefore, the high dislocation region 14 exists only at one side of the element. A back electrode 13 is formed at a position distanced by 80 μm from the center of the high dislocation region 14. In other respects, the structure of this semiconductor laser is the same as that in Sixth Embodiment. Therefore no further description of the structure will be made. As a result, a semiconductor laser having a high electrostatic withstand voltage, resistant to a power supply surge and having improved long-term reliability can be obtained.

Ninth Embodiment

Figure 17:
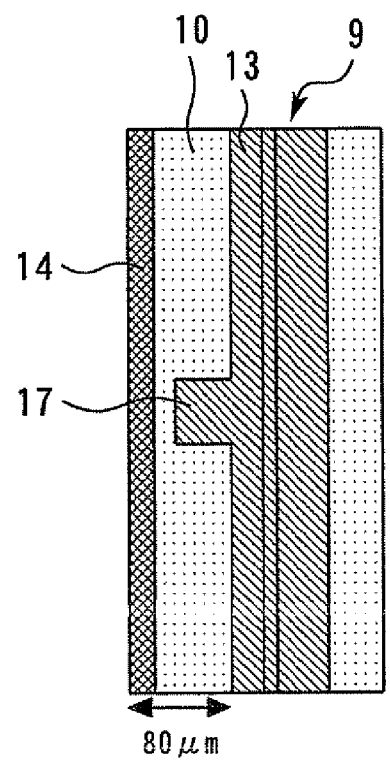
FIG. 17 is a bottom view of a semiconductor laser according to an embodiment of the invention.

FIG. 17 is a bottom view of a semiconductor laser according to Ninth Embodiment of the present invention. This semiconductor laser has, in addition to the construction in Eighth Embodiment, an electrode pad portion 17 for wiring on the back electrode 13. The electrode pad portion 17 has a width of 50 μm and length of 50 μm. The area of the back electrode 13 existing in the portion within a range of 60 μm from the center of the high dislocation region on the opposite sides of the same in the back electrode is 1500 μm$^2$ (2.5×L μm$^2$ if the resonator length is L (μm)). As a result, a semiconductor laser having a high electrostatic withstand voltage, resistant to a power supply surge and having improved long-term reliability can be obtained.

Tenth Embodiment

Figure 18:
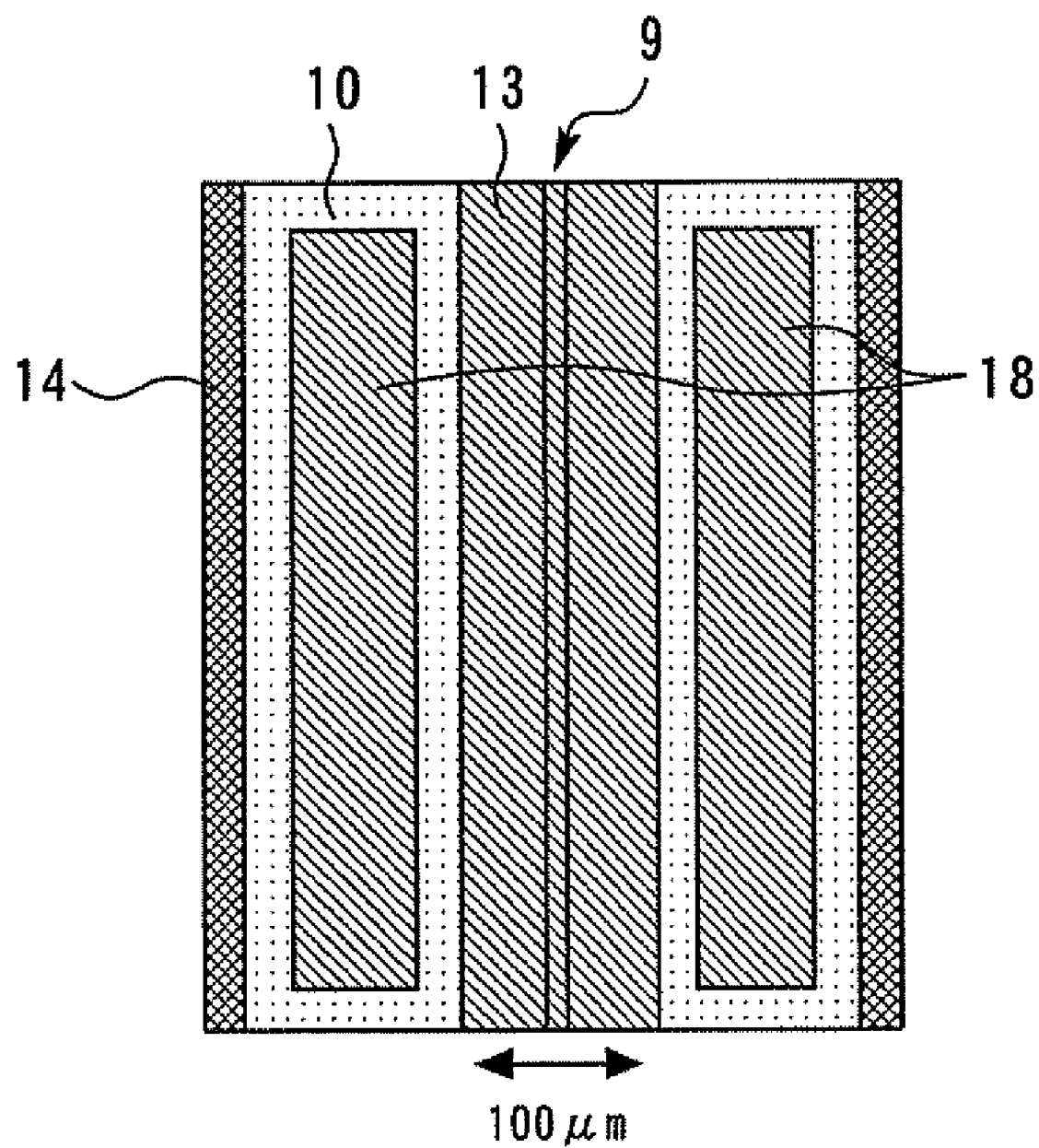
FIG. 18 is a bottom view of a semiconductor laser according to an embodiment of the invention.
Figure 19:
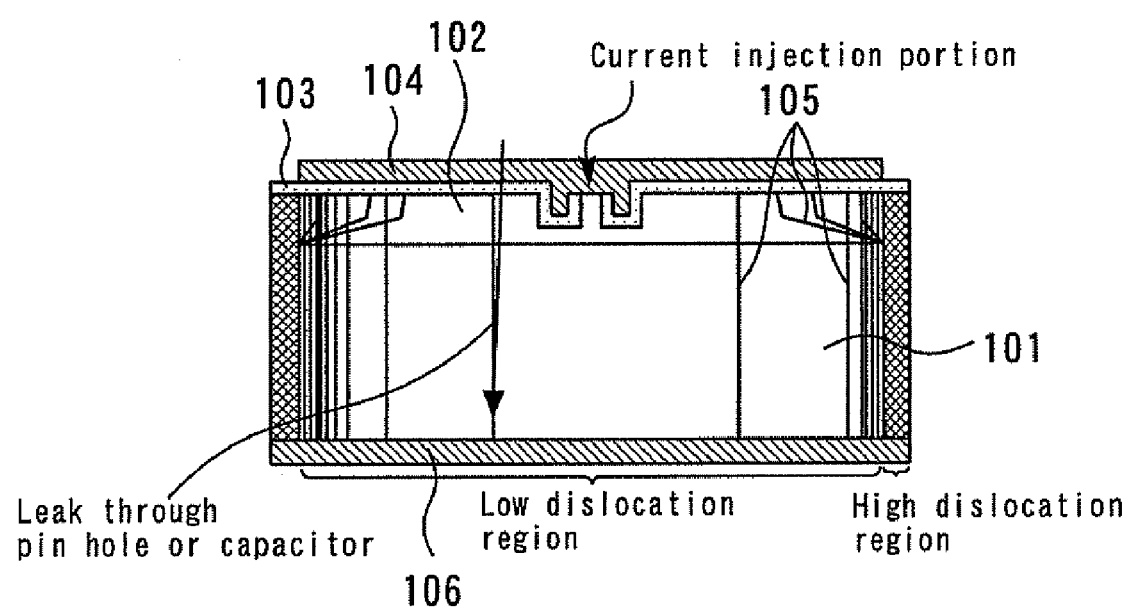
FIG. 19 is a cross-sectional view of a conventional semiconductor laser.

FIG. 18 is a bottom view of a semiconductor laser according to Tenth Embodiment of the present invention. This semiconductor laser is formed by cleavage to have a resonator length of 600 μm and separated to have a width of 400 μm. The element is separated at positions on high dislocation regions 14. Therefore, high dislocation regions exist at opposite sides of the element.

A back electrode 13 for supplying a current has a length of 600 μm in the resonator direction but has an extremely small width of 10 μm. The area of the surface electrode 12 is 100×L μm$^2$ if the resonator length is L (μm).

Further, back dummy electrodes 18 electrically insulated from the back electrode 13 are formed below the substrate at certain distances from the back electrode 13. No current is caused to flow through the back dummy electrodes 18. At the time of bonding of the back electrode 13 side to a sub mount by soldering, not only the back electrode 13 but also the back dummy electrodes 18 are bonded to the sub mount. Therefore, the bonding area is increased and the stability with which the element is bonded can be improved.

INDUSTRIAL APPLICABILITY

According to the present invention, a semiconductor laser having a high electrostatic withstand voltage, resistant to a power supply surge and having improved long-term reliability can be obtained by reducing a current leak through a threading dislocation portion.

What is claimed is:
1. A semiconductor laser comprising:
a substrate having opposite front and rear surfaces and a high dislocation region having a dislocation density of at least 1×10$^5$ cm$^{-2}$;
a crystalline semiconductor structure located on the front surface of the substrate and having an active layer;
an insulating film located on the semiconductor structure;
a surface electrode located on the insulating film and electrically continuous with the semiconductor structure for injection of a current into the active layer; and
a back electrode located on the rear surface of the substrate, wherein
the semiconductor laser includes a laser resonator having a length L, and
the surface electrode has an area not exceeding 120×L μm$^2$.
2. The semiconductor laser according to claim 1, wherein the area of the surface electrode does not exceed 80×L μm$^2$.
3. A semiconductor laser comprising:
a substrate having a high dislocation region having a dislocation density of at least 1×10$^5$ cm$^{-2}$;
a crystalline semiconductor structure located on the substrate and having an active layer;
an insulating film located on the semiconductor structure;
a surface electrode located on the insulating film and electrically continuous with the semiconductor structure for injection of a current into the active layer;
a back electrode located on a rear surface of the substrate, wherein
the semiconductor laser includes a laser resonator having a length L,
the surface electrode has an area not exceeding 120×L μm$^2$; and
a surface dummy electrode located on the insulating film, and through which no current flows.
4. The semiconductor laser according to claim 3, wherein the area of the surface electrode does not exceed 80×L μm$^2$.
5. A semiconductor laser comprising:
a GaN substrate having a high dislocation region having a dislocation density of at least 1×10$^5$ cm$^{-2}$;
a crystalline semiconductor structure located on the front surface of the GaN substrate and having an active layer;
an insulating film located on the semiconductor structure;
a surface electrode located on the insulating film and electrically continuous with the semiconductor structure for injection of a current into the active layer; and
a back electrode located on a rear surface of the GaN substrate, wherein
the semiconductor laser includes a laser resonator having a length L, and
the surface electrode has an area not exceeding 120×L μm$^2$.
6. The semiconductor laser according to claim 5, wherein the area of the surface electrode does not exceed 80×L μm$^2$.
7. The semiconductor laser according to claim 5, wherein the GaN substrate has opposite front and rear surfaces and the crystalline semiconductor structure is disposed on the front surface of the GaN substrate.

* * * * *